United States Patent
Takami (10) Patent No.: US 7,534,712 B2
(45) Date of Patent: May 19, 2009

(54) SEMICONDUCTOR DEVICE AND METHOD FOR FABRICATING THE SAME

(75) Inventor: Masatoshi Takami, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/802,313

(22) Filed: May 22, 2007

(65) Prior Publication Data

US 2007/0224761 A1    Sep. 27, 2007

Related U.S. Application Data

(62) Division of application No. 10/781,811, filed on Feb. 20, 2004, now Pat. No. 7,235,849.

(30) Foreign Application Priority Data

Sep. 19, 2003    (JP)    ............... 2003-327946

(51) Int. Cl.
 *H01L 21/44*    (2006.01)
(52) U.S. Cl. ............... 438/597; 438/643; 257/E21.046
(58) Field of Classification Search ........... 438/643, 438/597, 627
See application file for complete search history.

(56) References Cited

U.S. PATENT DOCUMENTS 3,996,482 A    12/1976    Lockwood 5,793,110 A    8/1998    Yamaha et al.
6,613,586 B2 *    9/2003    Bailey ................... 438/3
2002/0185664 A1    12/2002    Dixit et al.

FOREIGN PATENT DOCUMENTS

| JP | 07-74167 A | 3/1995 |
| JP | 08222633 | 8/1996 |
| JP | 09-252131 A | 9/1997 |

OTHER PUBLICATIONS

Office Action dated Feb. 5, 2008, in corresponding Japanese Application No. 2003-327946.

* cited by examiner

*Primary Examiner*—W. David Coleman
(74) *Attorney, Agent, or Firm*—Westerman, Hattori, Daniels & Adrian, LLP.

(57) ABSTRACT

The semiconductor device comprises a silicon substrate 10 having a device region 11, a transistor including a gate electrode 20 formed in the device region 11 with the gate insulation film 14 formed therebetween, and a dummy metal layer 52 formed over the gate electrode 20 with an inter-layer insulation film 32 formed therebetween, formed of a metal material having the property of occluding hydrogen and having a peripheral part positioned outer of a region where the region for the gate electrode 20 formed in and the device region 11 overlap each other.

5 Claims, 11 Drawing Sheets

SEMICONDUCTOR DEVICE AND METHOD FOR FABRICATING THE SAME

CROSS-REFERENCE TO RELATED APPLICATION

This application is a divisional of application Ser. No. 10/781,811 filed Feb. 20, 2004, which is based on and claims priority of Japanese Patent Application No. 2003-327946, filed on Sep. 19, 2003, the contents being incorporated herein by reference.

BACKGROUND OF THE INVENTION

The present invention relates to a semiconductor device comprising MOS (Metal Oxide Semiconductor) transistors and a method for fabricating the semiconductor device, more specifically, a semiconductor device subjected to hydrogen annealing for recovering damages caused in the fabrication steps, and a method for fabricating the semiconductor device.

Conventionally, hydrogen annealing is performed for recovering damages by etching, etc. is made on MOS transistors. Such hydrogen annealing is made under conditions of, e.g., an atmosphere containing hydrogen and nitrogen, a 5-20% hydrogen concentration, a 350-450° C. temperature and 10-130 minutes (refer to Japanese Patent Application Unexamined Publication No. Hei 7-74167 (1995)).

Furthermore, for the hydrogen annealing for recovering the step damages is also proposed a method for fabricating a semiconductor device in which for making the damage recovery sufficient even in the presence of interconnection layers containing titanium layers, the hydrogen concentration of the annealing atmosphere is set in consideration of the hydrogen occluded amounts of the titanium layers (refer to Japanese Patent Application Unexamined Publication No. Hei 9-252131 (1997)).

High relative accuracy is required of the MOS transistors of semiconductor integrated circuits. Such integrated circuits are, e.g., differential circuit unit of operational amplifiers and comparators, differential circuits used in the comparators of successive A/D converters, pipeline A/D converters, etc., current mirror circuits used in the current mirror units of current output D/A converters, and others. These semiconductor integrated circuits are used in various electrical apparatus and communication systems; they are used, e.g., in the operational amplifiers of cellular phones, modems, etc., the successive A/D converters of digital cameras, video cameras, sensors, etc., the pipeline A/D converters of wireless LANs, FWAs (Fixed Wireless Accesses), digital TVs, etc., and the current output D/A converters of TVs, VTRs, digital cameras, video cameras, wireless LANs, FWAs, etc.

SUMMARY OF THE INVENTION

The present invention is to provide a semiconductor device including MOS transistors of high relative accuracy, and a method for fabricating the semiconductor device.

According to one aspect of the present invention, there is provided a semiconductor device comprising: a semiconductor substrate having a device region; a transistor including a gate electrode formed in the device region with a gate insulation film formed therebetween; and a metal layer formed over the gate electrode with an insulation film formed therebetween, formed of a metal material having the property of occluding hydrogen and having a peripheral part positioned outer of a region where the region for the gate electrode formed in and the device region overlap each other.

According to another aspect of the present invention, there is provided a semiconductor device comprising: a semiconductor substrate having a first device region and a second device region; a first transistor including a first gate electrode formed in the first device region with a first gate insulation film formed therebetween; a second transistor forming a pair with the first transistor and including a second gate electrode formed in the second device region with a second gate insulation film formed therebetween; a first metal layer formed over the first gate electrode with an insulation film formed therebetween, formed of a metal material having the property of occluding hydrogen and having a peripheral part positioned outer of a region where the region for the first gate electrode formed in and the first device region overlap each other; and a second metal layer formed over the second gate electrode with the insulation film formed therebetween, formed of metal material having the property of occluding hydrogen and having a peripheral part positioned outer of a region where the region for the second gate electrode formed in and the second device region overlap each other.

According to further another aspect of the present invention, there is provided a method for fabricating a semiconductor device comprising the steps of: defining a device region on a semiconductor substrate; forming a gate electrode in the device region with a gate insulation film formed therebetween; forming a metal film of a metal material having the property of occluding hydrogen over the gate electrode with an insulation film formed therebetween; patterning the metal film to form over the gate electrode a metal layer formed of the metal film and having a peripheral part positioned outer of a region where the region for the gate electrode formed in and the device region overlap each other; and thermally processing the semiconductor substrate with the metal layer formed on in an atmosphere containing hydrogen.

According to further another aspect of the present invention, there is provided a method for fabricating a semiconductor device comprising the steps of: defining a first device region and a second device region on a semiconductor substrate; forming a first gate electrode in the first device region with a first gate insulation film formed therebetween, and a second gate electrode in the second device region with a second gate insulation film formed therebetween; forming a metal film of a metal material having the property of occluding hydrogen on the first gate electrode with an insulation film formed therebetween; patterning the metal film to form over the first gate electrode a metal layer of the metal film and having a peripheral part positioned outer of a region where the region for the first gate electrode formed in and the first device region overlap each other; and thermally processing the semiconductor substrate with the metal layer formed on in an atmosphere containing hydrogen, in the step of thermally processing the semiconductor substrate in the atmosphere containing hydrogen, the metal layer homogeneously suppressing the hydrogen termination of the interface between the semiconductor substrate and the first gate insulation film, and terminating with hydrogen the interface between the semiconductor substrate and the second gate insulation film.

As described above, the semiconductor device according to the present invention comprises a semiconductor substrate with a device region defined, a transistor including a gate electrode formed in the device region with a gate insulation film formed therebetween, and a metal layer formed over the gate electrode with an insulation film formed therebetween, formed of a metal material having the property of occluding hydrogen and having a peripheral part positioned outer of a region where the region for the gate electrode formed in and the device region overlap each other, whereby in hydrogen annealing of the fabrication process, the hydrogen termination of the interface between the silicon substrate and the gate insulation film can be suppressed homogeneously. Resultantly, the MOS transistor can have high relative accuracy.

DETAILED DESCRIPTION OF THE INVENTION

A First Embodiment

Figure 1A:
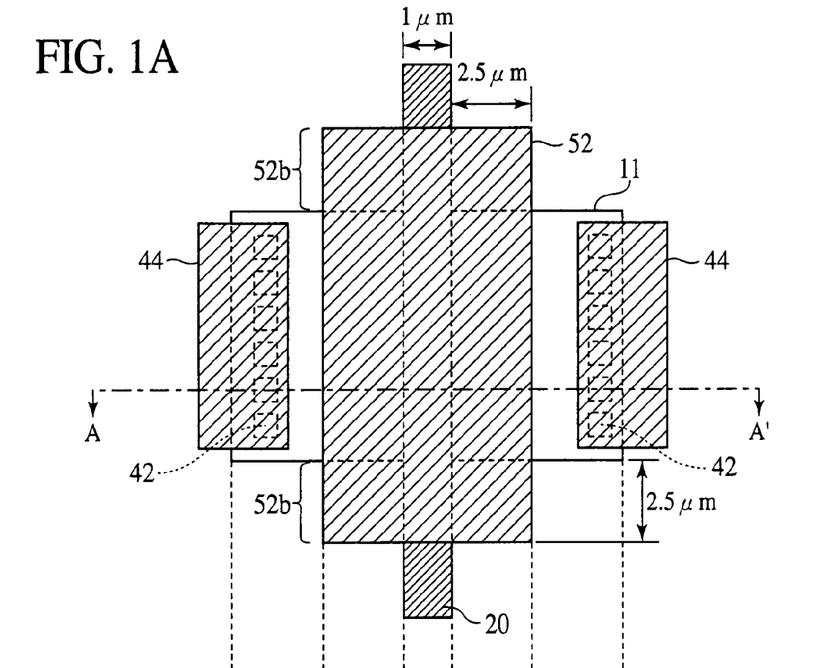
FIGS. 1A-1B are diagrammatic views of the semiconductor device according to a first embodiment of the present invention, which show a structure thereof.
Figure 1B:
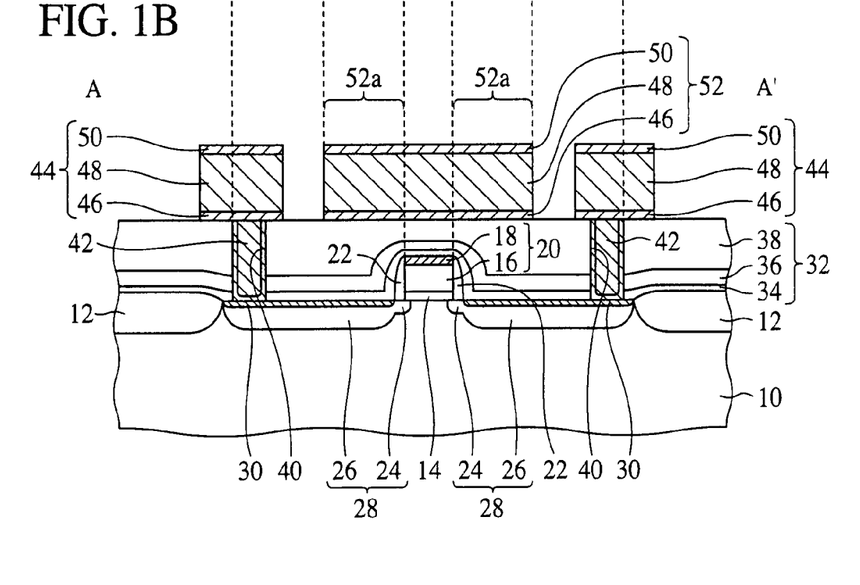
Figure 2A:
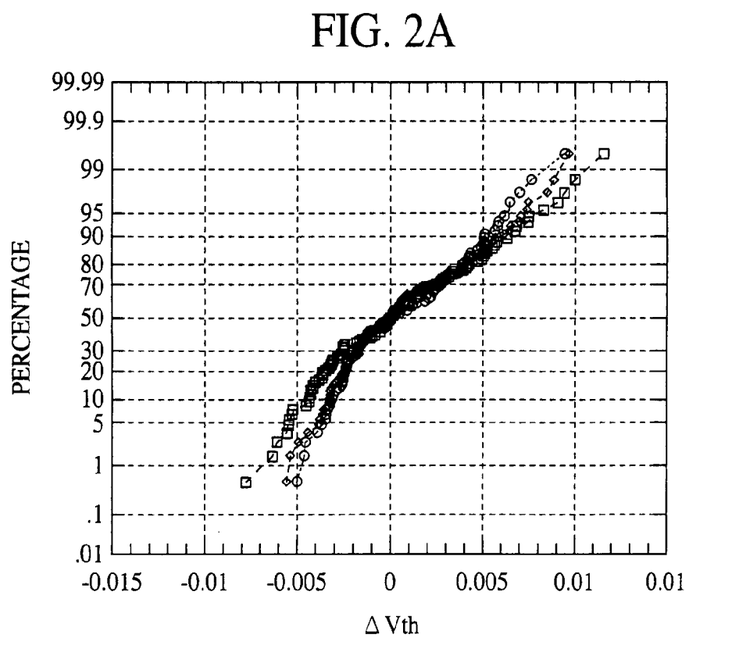
FIGS. 2A-2B are graphs of the dependency of the threshold voltage of MOS transistors on a dummy metal layer.
Figure 2B:
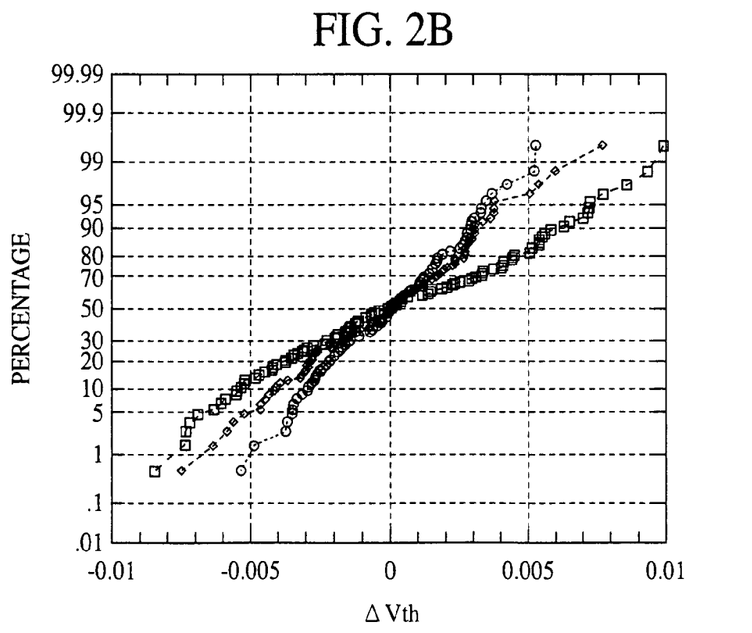
Figure 3:
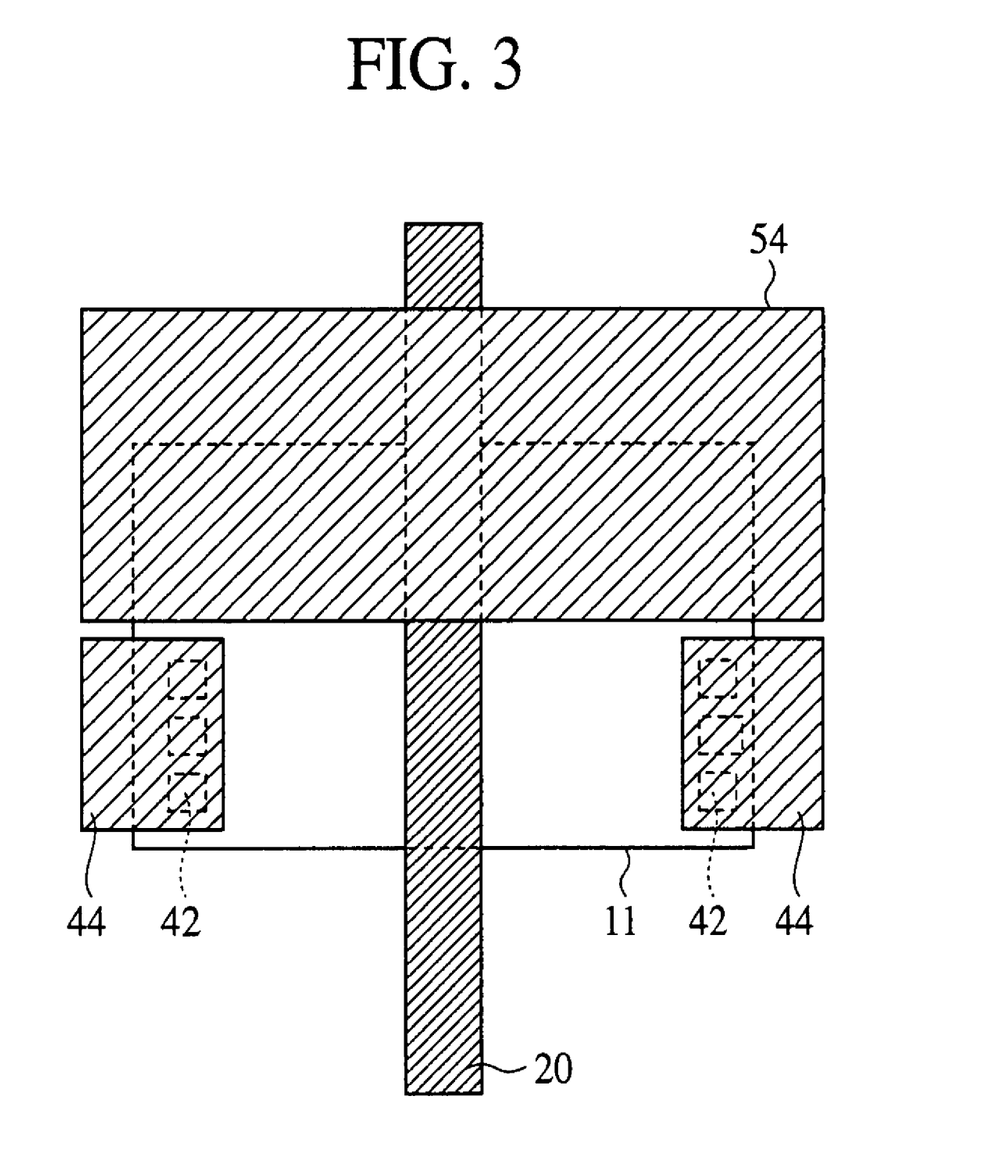
FIG. 3 is a plan view of a semiconductor device having the dummy metal layer formed in the same shape as the signal interconnection, which shows the structure thereof.
Figure 4:
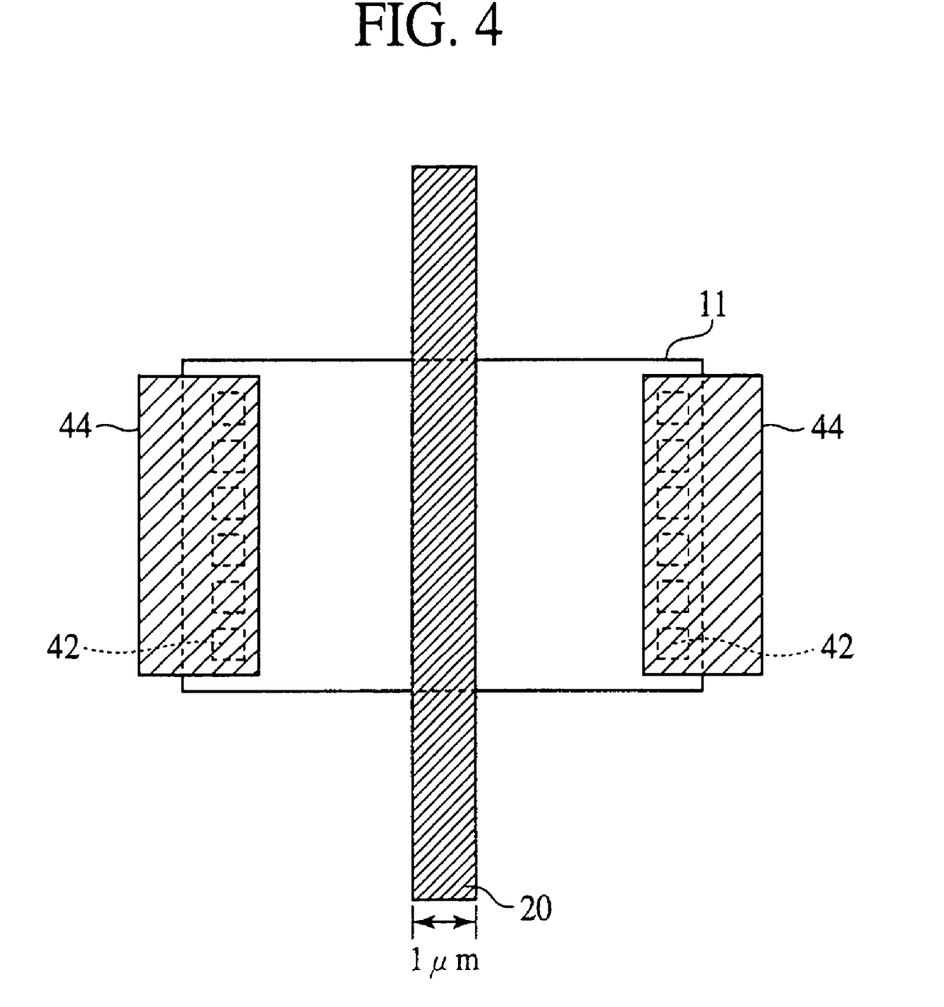
FIG. 4 is a plan view of the conventional semiconductor device without the dummy metal layer, which shows the structure thereof.

The semiconductor device and method for fabricating the same according to a first embodiment of the present invention will be explained with reference to FIGS. 1A-1B, 2A-2B, 3, 4, 5A-5C, 6A-6C, 7A-7C and 8A-8B. FIGS. 1A-1B are diagrammatic views of the semiconductor device according to the present embodiment, which shows a structure thereof. FIGS. 2A-2B are graphs of the dependency of the threshold voltage of MOS transistors on the dummy metal layer. FIG. 3 is a plan view of the semiconductor device having the dummy metal layer in the same configuration as the signal interconnection, which shows a structure. FIG. 4 is a plan view of the conventional semiconductor device including no dummy metal layer, which shows the structure thereof. FIGS. 5A-5C, 6A-6C, 7A-7C and 8A-8B are sectional views of the semiconductor device in the steps of the method for fabricating the semiconductor device, which show the method.

First, the structure of the semiconductor device according to the present embodiment will be explained with reference to FIGS. 1A-1B. FIG. 1A is a plan view of the semiconductor device according to the present embodiment, which shows the structure. FIG. 1B is the sectional view along the line A-A' in FIG. 1A.

A device isolation film 12 for defining device regions 11 is formed on a silicon substrate 10.

On the silicon substrate 10 in a device region 11, a gate electrode 20 of a polysilicon film 16 and a tungsten silicide film 18 laid the latter on the former with a gate insulation film 14 of a silicon oxide film formed therebetween. A sidewall insulation film 22 is formed on the side wall of the gate electrode 20.

A dopant impurity is lightly implanted in the silicon substrate 10 in the device region 11 by self-alignment with the gate electrode 20 to form lightly doped diffused layers 24. A dopant impurity is heavily implanted by self-alignment with the sidewall insulation film 22 and the gate electrode 20 to form heavily doped diffused layers 26. The lightly doped diffused layers 24 and the heavily doped diffused layers 26 constitute source/drain diffused layers of LDD (Light Doped Drain) structure. Silicide films 30 are formed on the source/drain diffused layers 28.

Thus, a MOS transistor including the gate electrode 20 and the source/drain diffused layers 28 is formed on the silicon substrate 20 in the device region. The MOS transistor constitutes, e.g., a part of a differential circuit or a part of a current mirror circuit.

An inter-layer insulation film 32 is formed on the silicon substrate 10 with the MOS transistor formed on. The inter-layer insulation film 32 is formed of, e.g., a 20 nm-thickness silicon oxide film 34, a 70 nm-thickness silicon nitride film 36 formed on the silicon oxide film 34, and a 700 nm-thickness silicon oxide film 38 formed on the silicon nitride film 36.

Contact holes 40 are formed in the inter-layer insulation film 32 down to the silicide films 30. Contact plugs 42 are buried in the contact holes 40, electrically connected to the source/drain diffused layers 28 via the silicide films 30.

On the inter-layer insulation film 32 with the contact plugs 42 buried in, Interconnection layers 44 are formed, electrically connected to the source/drain diffused layers 28 via the contact plugs 42 and the silicide films 30. The interconnection layer 44 is formed of, for example, a layer film 46 of a 60 nm-thickness titanium (Ti) film and a 30 nm-thickness titanium nitride film (TiN) laid the latter on the former on the inter-layer insulation film 32, a 400 nm-thickness aluminum film 48 formed on layer film 46, and a layer film 50 of a 5 nm-thickness titanium film and a 70 nm-thickness titanium nitride film laid the latter on the former on the aluminum film 48.

A dummy metal layer 52 is formed of a metal material having the property of occluding hydrogen on the inter-layer insulation film 32 between the interconnection layers 44 electrically connected to the source/drain diffused layers 18 in a region containing the region above the gate electrode 20 with the peripheral part positioned outside a region where the region for the gate electrode 20 formed in and the device region 11 overlap each other. The dummy metal layer 52 is formed of one and the same metal film forming the interconnection layer 44 and is formed of, e.g., the layer film 46 of the titanium film and titanium nitride film formed laid the latter on the former on the inter-layer insulation film 32, the aluminum film 48 formed on the layer film 46, and the layer film 50 of the titanium film and titanium nitride film laid the latter on the former on the aluminum film 48. The dummy metal layer 52 has, e.g., rectangular plane shape as exemplified in FIG. 1A. The titanium contained in the layer film 46 and the layer film 50 has the property of occluding hydrogen. On the other hand, the aluminum film 48 does not have the property of occluding hydrogen. The potential of the dummy metal layer 52 is fixed at a prescribed potential, e.g., the earth potential or others or floating.

As shown in FIGS. 1A and 1B, the dummy metal layer 52 is formed wider than the gate electrode 20 in the direction of extension of the channel of the MOS transistor, i.e., in the direction normal to the direction of extension of the gate electrode 20 (the horizontal direction of the drawings of FIGS. 1A and 1B) and has eaves parts 52a projected respectively over both sides of the region above the gate electrode 20. For example, for the gate electrode 20 of a 1 μm-width, the dummy metal layer 52 has a 6 μm-width and has the eaves parts 52a, which are projected respectively over both sides of the gate electrode 20 in a 2.5 μm-width. The ratio of the thickness of the inter-layer insulation film 32 to the width of the eaves part 52a of the dummy metal layer 52 is, e.g., 0.79 (μm)/2.5 (μm)=0.316.

As shown in FIG. 1A, the dummy metal layer 52 is formed wider than the device region 11 in the direction of extension of the gate electrode 20 (the vertical direction of the drawing of FIG. 1A) and has eaves parts 52b projected respectively over both sides of the device region 11. For example, the eaves parts 52b are projected respectively over both sides of the source/drain diffused layer 28 in a 2.5 μm-width. The ratio of the thickness of the inter-layer insulation film 32 to the width of the eaves part 52b of the dummy metal layer 52 is, e.g., 0.79 (μm)/2.5 (μm)=0.316, which is similar to the case of the eaves part 52a.

As described above, the semiconductor device according to the present embodiment is characterized mainly by the dummy metal layer 52 which is formed over the gate electrode 20 with the inter-layer insulation film 32 formed therebetween, is formed of a metal material having the property of occluding hydrogen and has the peripheral part positioned outer of the region where the region for the gate electrode 20 formed in and the device region 11 overlap each other.

One of the causes for characteristic deviations of transistors in the interconnection forming steps of the semiconductor device fabrication is often the accumulation of charged stresses in the gate electrodes. The accumulation of charged stresses in the gate electrodes is caused by plasmas generated upon forming the inter-interconnection layer films, ions scattered upon the processing of the interconnection electrodes, etc. The charged stresses are accumulated in the gate electrodes to thereby increase the interface level of the gate insulation film, which resultantly causes characteristic deviations of the transistors.

Most of such characteristic deviations of transistors are recovered by the heat of the final annealing step following the interconnection forming steps. The final annealing in a hydrogen atmosphere terminates the interface between the semiconductor substrate and the gate insulation film with hydrogen, whereby the improvement of hot carrier immunity is realized. However, in the fabrication process for the recent semiconductor devices using silicides in the source/drain electrodes of the transistors and alloys of aluminum and copper or copper as the interconnection materials, it is necessary to make the heat hysteresis of the interconnection forming steps as low as possible. This makes it difficult to set the final hydrogen annealing at high temperatures. Accordingly, the hydrogen termination of the interfaces between the semiconductor substrates and the gate insulation films by the hydrogen annealing inhomogeneous. To depress the deterioration of the interconnection due to electromigration, in many cases titanium is used as a part of the interconnection materials. Because titanium has the property of occluding hydrogen, the hydrogen termination of the interface between the semiconductor substrates and the gate insulation film near the interconnections using titanium is partially suppressed.

As described above, due to the lower processing temperatures, the use of titanium as an interconnection material, etc., in the recent MOS transistors, the hydrogen termination of the interfaces between the semiconductor substrates and the gate insulation films is insufficient and inhomogeneous. Such inhomogeneous hydrogen termination is a cause of variations of threshold voltages, etc. and is one of the causes for the decrease of the relative accuracy of the MOS transistors.

Figure 11:
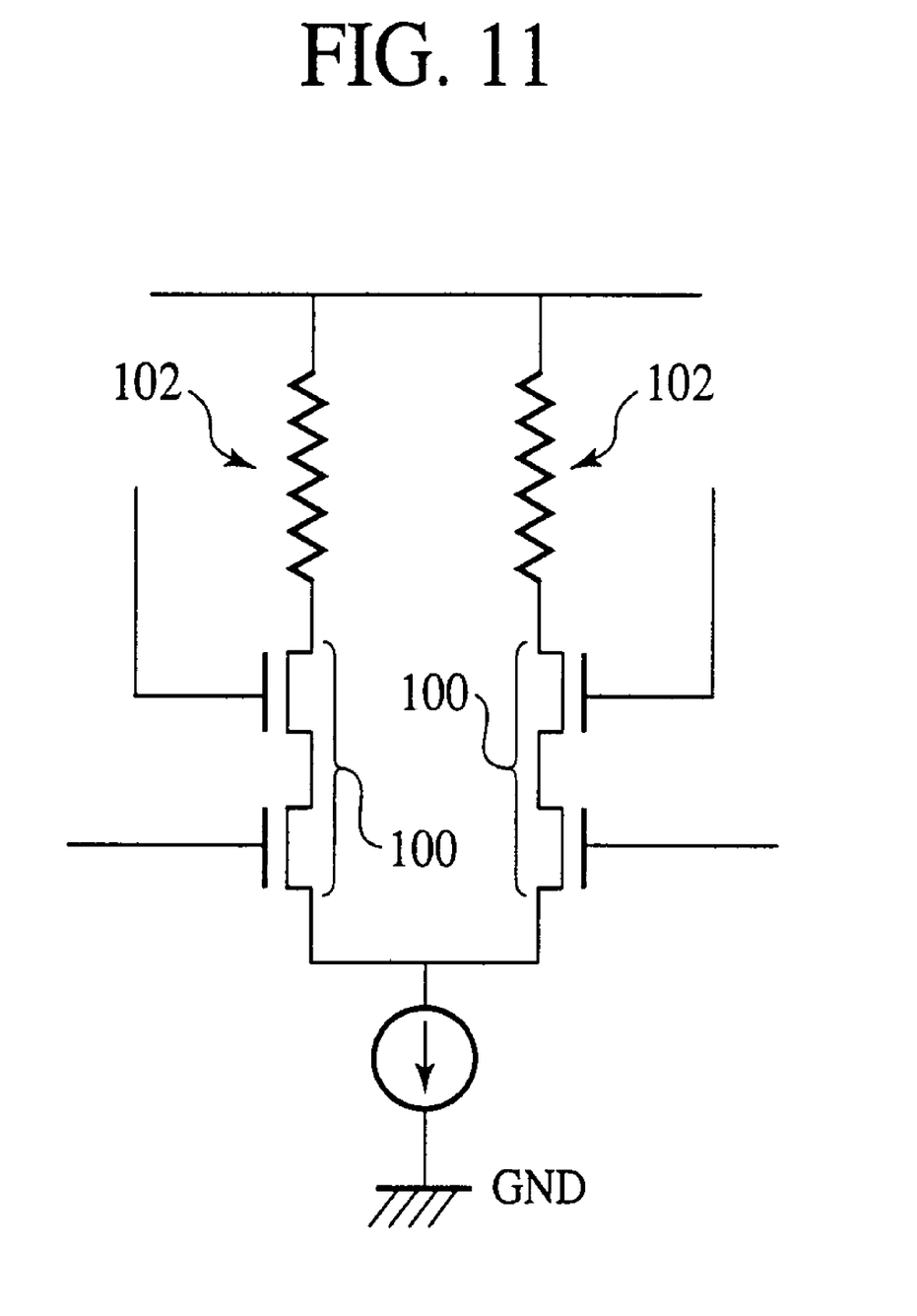
FIG. 11 is a circuit diagram of one example of the differential circuit which requires high relative accuracy of the MOS transistor.

FIG. 11 is the circuit diagram of one example of the differential circuits which require high relative accuracy of the MOS transistors. As shown, circuits each comprising a CMOS transistor 100 and a resistant element 102 serially connected to each other are connected to each other in parallel. Each resistant element 102 has one end connected to an electric power source line which applies a source voltage to the differential circuit. Either of the source/drain of each CMOS transistor 100 is connected to a ground potential line. In such a differential circuit, high relative accuracy is required of the respective MOS transistor composing the CMOS transistors.

However, the recent fabrication steps of semiconductor devices are performed at lower temperatures. Accordingly, as the gate electrodes of the transistors have larger areas, the above-described hydrogen annealing for recovering damages in the fabrication steps makes the termination of dangling bonds present in the interface between the semiconductor substrate and the gate insulation film with hydrogen inhomogeneous. Consequently, it is difficult to realize high relative accuracy in the MOS transistors. The present embodiment can solve such difficulty.

In the semiconductor device according to the present embodiment, a region containing the region above the gate electrode 20 is covered by the dummy metal layer 52 containing a metal material, such as titanium or others, having the property of occluding hydrogen, whereby owing to the hydrogen occluding action of metals, such as titanium, etc. the hydrogen termination of the interface between the silicon substrate 10 and the gate insulation film 14 by the hydrogen annealing can be suppressed homogeneously. The hydrogen termination itself is suppressed homogeneously, whereby the insufficient hydrogen termination of the interface between the silicon substrate 10 and the gate insulation film 14 never takes pace, and the MOS transistor can have high relative accuracy.

The ratios of the thickness of the inter-layer insulation film 32 to the width of the eaves part 52a of the dummy metal layer 52 projected outward beyond the gate electrode 20 or to the width of the eaves part 52b projected outward beyond the device region 11, i.e., the ratio of the gap between the silicon substrate 10 and the dummy metal layer 52 to the gap between the region where the region for the gate electrode 20 formed in and the device region 11 overlap each other and the peripheral part of the dummy metal layer 52 can be suitably set. This ratio is set to be 0.32 or less than 0.32, whereby the hydrogen termination of the interface between the silicon substrate 10 and the gate insulation film 14 can be suppressed homogeneously with a higher certainty.

According to the present embodiment, in the semiconductor device comprising a MOS transistor, specifically the semiconductor device comprising a MOS transistor which is used in analog circuits, etc. and has very low operational frequency, the characteristic stability of which is more important than the hot carrier immunity, and which requires high relative accuracy, the hydrogen termination of the interface between the silicon substrate 10 and the gate insulation film 14 is suppressed homogeneously, whereby the relative accuracy can be improved.

FIGS. 2A and 2B are graphs of the dependency of the threshold voltage of the MOS transistors on the dummy metal layer. In the graph of FIG. 2A for an n type MOS transistor and the graph of FIG. 2B for a p type MOS transistor, variations ΔVth of the respective threshold voltage of the MOS transistors were measured, and the ratios (%) of their distributions were plotted. The ΔVth is expressed by ΔVth=Vth(n)−Median(Vth(n)) where a threshold voltage is represented by Vth(n), and its median is represented by Median (Vth(n)). In the graphs of FIGS. 2A and 2B, the plots marked by ◯ are of the results measured on the semiconductor device according to the present embodiment shown in FIG. 1. The plots marked by ☐ are of the results measured on the semiconductor device shown in FIG. 3 in which, in place of the dummy metal layer 52 in FIG. 1, a dummy metal layer 54 in the same shape as the signal interconnection is formed. In the semiconductor device shown in FIG. 3, the dummy metal layer 54 is not formed on the inter-layer insulation film between the interconnection layers 44 electrically connected to the source/drain diffused layers. The plots marked by ◊ are of the results measured on the conventional semiconductor device shown in FIG. 4, in which the dummy metal layer 52 is not formed.

As evident from the graphs of FIGS. 2A and 2B, it is found that both in the n type MOS transistor and the p type MOS transistor, the semiconductor device according to the present embodiment shown in FIGS. 1A and 1B, which includes the dummy metal layer 52 covering a region containing the region above the gate electrode 20 has smaller characteristic deviations than the conventional semiconductor device shown in FIG. 4, in which the dummy metal layer 52 is not formed. Based on this result, the present embodiment can improve the relative accuracy of the MOS transistor and can make the area of the MOS transistor smaller.

Then, the method for fabricating the semiconductor device according to the present embodiment will be explained with reference to FIGS. 5A-5C, 6A-6C, 7A-7C, and 8A-8B.

Figure 5A:
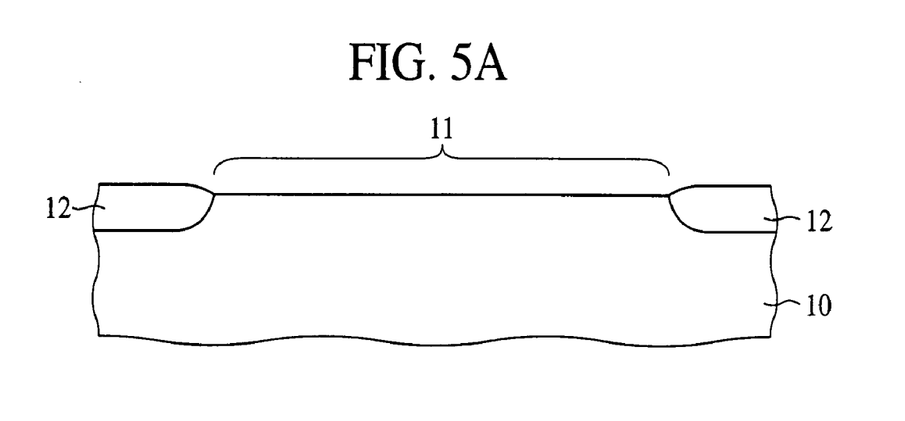
FIGS. 5A-5C are sectional views of the semiconductor device according to the first embodiment of the present invention in the steps of the method for fabricating the semiconductor device, which show the method (Part 1).

First, the device isolation film 12 is formed on the surface of the silicon substrate 10 (see FIG. 5A). The device isolation film 12 can be formed in the following way by, e.g., LOCOS (LOCal Oxidation of Silicon). A p type epitaxial wafer of, e.g., a 10±1.5 Ω·cm specific resistance, crystal face (100) and a 1 μm-thickness as the silicon substrate 10 is thermally oxidized, e.g., in an atmosphere containing nitrogen at 850° C. to form a pad oxide film of a silicon oxide film of, e.g., a 5 nm-thickness on the surface of the silicon substrate 10. Next, a silicon nitride film of, e.g., a 115 nm-thickness is deposited on the entire surface by, e.g., CVD (Chemical Vapor Deposition). Next, the silicon nitride film is patterned into a prescribed configuration by photolithography and dry etching to leave the silicon nitride film in the region to be the device region. Then, with the silicon nitride film as a mask, the substrate is oxidized by thermal processing in a dry oxygen atmosphere at 1100° C. to form the device isolation film 12 of the silicon oxide film of, e.g., a 370 nm-thickness. After the device isolation film 12 has been formed, the silicon nitride film used as the mask for the growth of the oxide film is removed by wet etching. Thus, the device isolation film 12 defining the device region 11 is formed by LOCOS. The device isolation film 12 may be formed by another processing, such as STI (Shallow Trench Isolation) or others.

Figure 5B:
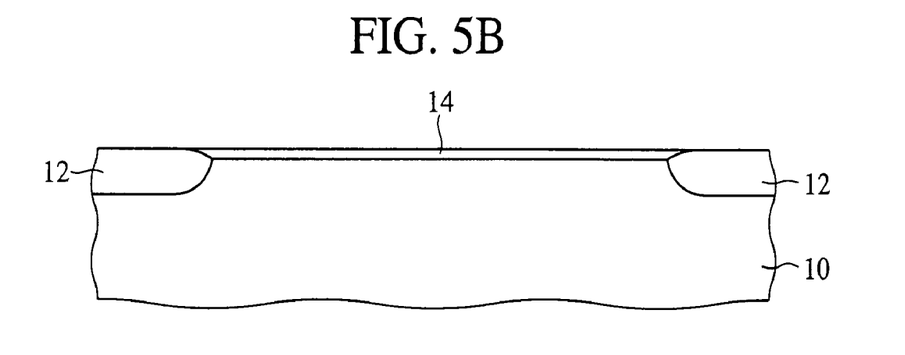

Then, after the pad oxide film has been removed, the surface of the silicon substrate 10 is thermally oxidized by, e.g., thermal oxidation to form the gate insulation film 14 of a silicon oxide film of, e.g., a 5 nm-thickness in the device region 11 (see FIG. 5B).

Next, a polysilicon film of, e.g., a 50 nm-thickness is deposited on the entire surface by, e.g. CVD.

Then, a tungsten silicide film 18 of, e.g., a 150 nm-thickness is deposited on the polysilicon film 14 by, e.g., CVD.

Figure 5C:
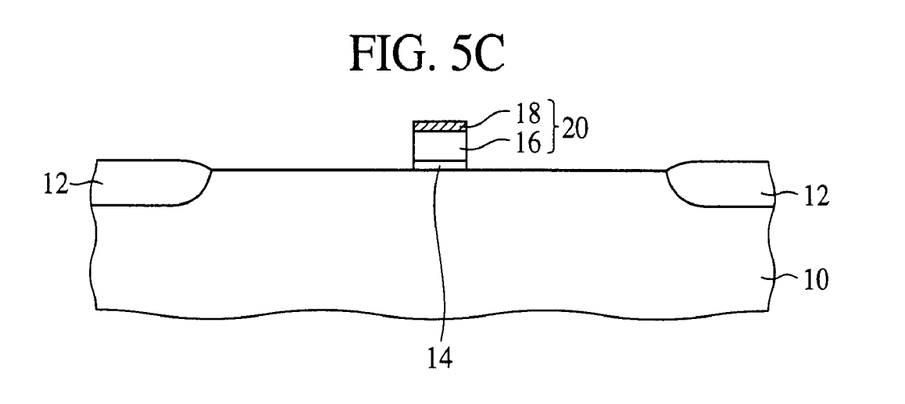

Next, the tungsten silicide film 18 and the polysilicon film 16 are patterned by photolithography and dry etching to form in the device region 11 the gate electrode 20 of the polysilicon film 16 and the tungsten silicide film 18 laid the latter on the former (see FIG. 5C).

Figure 6A:
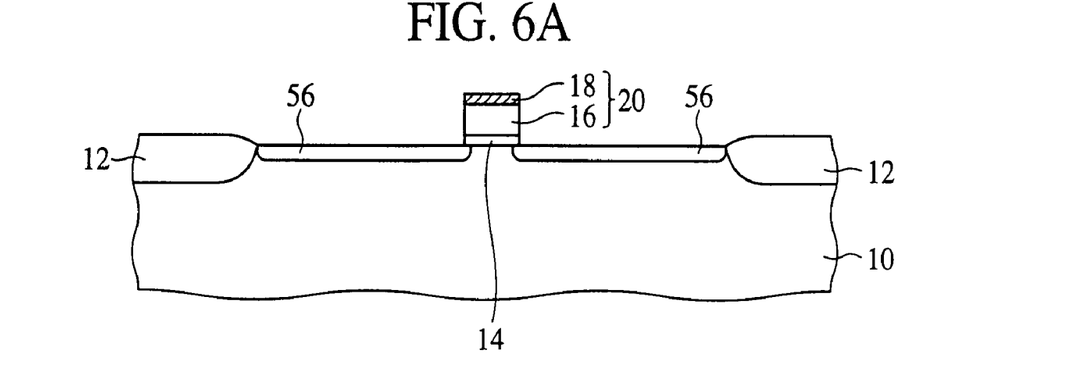
FIGS. 6A-6C are sectional views of the semiconductor device according to the first embodiment of the present invention in the steps of the method for fabricating the semiconductor device, which show the method (Part 2).

Next, with the gate electrode 20 as a mask, arsenic (As) ions, for example, are implanted to form in the silicon substrate 10 on both sides of the gate electrode 20 lightly doped impurity diffused regions 56 which are to be the lightly doped diffused layer 24 of LDD structure (see FIG. 6A).

Then, a silicon oxide film of, e.g., a 120 nm-thickness is deposited on the entire surface by, e.g., CVD and then etched back to form the sidewall insulation film 22 of the silicon oxide film on the side wall of the gate electrode 20.

Figure 6B:
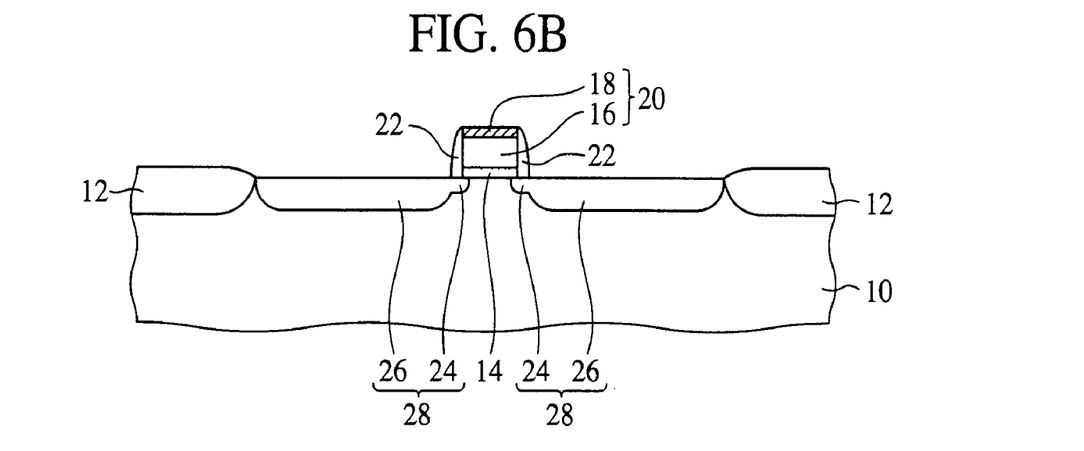

Then, with the gate electrode 20 and the sidewall insulation film 22 as a mask, arsenic (As) ions, for example, are implanted to form in the silicon substrate 10 on both sides of the gate electrode 20 and the sidewall insulation film 22 heavily doped impurity diffused regions which are to be the heavily doped layer 26 of LDD structure.

Then, prescribed thermal processing is performed to activate the implanted impurities to thereby form in the silicon substrate 10 on both sides of the gate electrode 20 the source/drain diffused layers 28 of LDD structure formed of the lightly doped diffused layer 24 and the heavily doped diffused layer 26 (see FIG. 6B).

Figure 6C:
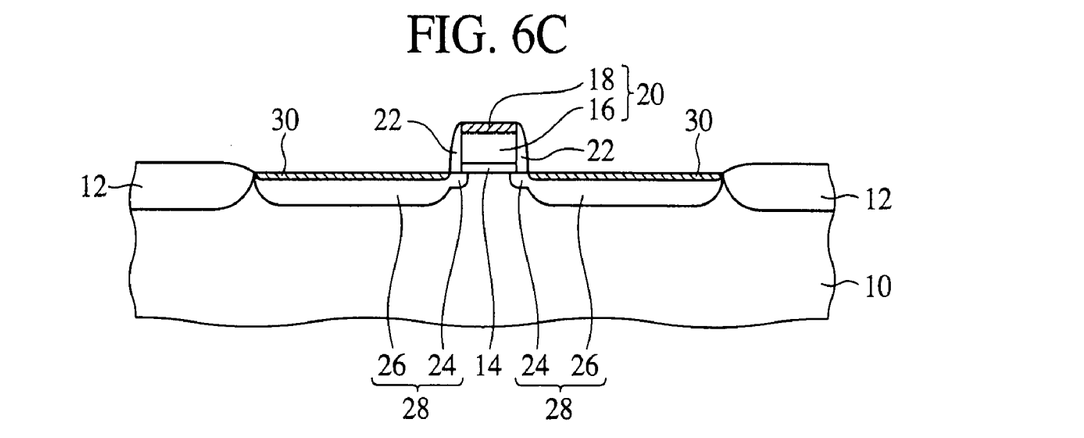

Next, a silicide film 30 is formed selectively on the source/drain diffused layer 28 by salicide process (see FIG. 6C). The silicide film 30 is formed on the source/drain diffused layers 28, e.g., by depositing a metal film of titanium or others on the entire surface, performing thermal processing to react the metal film with the exposed silicon and form a silicide film, and removing the metal film which has not reacted.

Figure 7A:
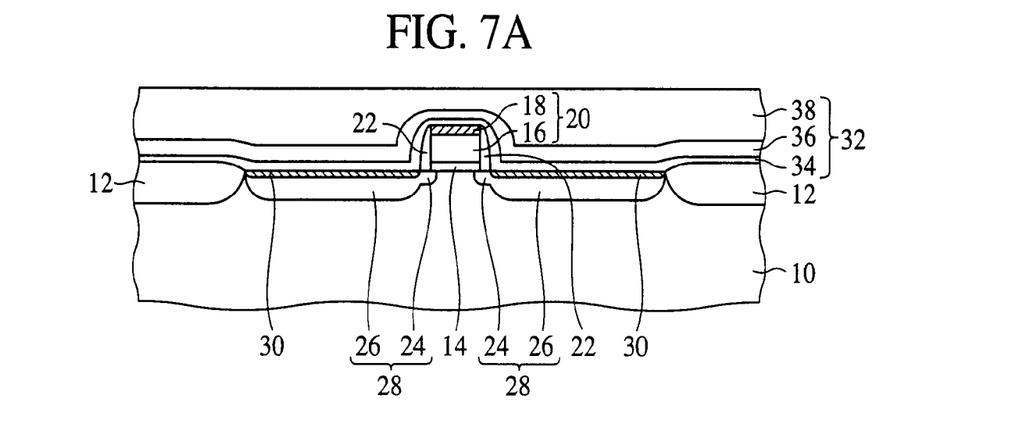
FIGS. 7A-7C are sectional views of the semiconductor device according to the first embodiment of the present invention in the steps of the method for fabricating the semiconductor device, which show the method (Part 3).

Then, a silicon oxide film (HTO (High Temperature Oxide) film) 34 of, e.g., a 20 nm-thickness is deposited on the entire surface by, e.g., plasma CVD.

Next, a silicon nitride film 36 of, e.g., a 70 nm-thickness is deposited on the entire surface by, e.g., plasma CVD. The silicon nitride film 36 is for blocking the intrusion of water to the side of the silicon substrate 10 with the MOS transistor formed on. The refractive index of the silicon nitride film 36 is, e.g., 2.24.

Then, a silicon oxide film 38 of, e.g., a 1000 nm-thickness is deposited on the entire surface by plasma CVD using, e.g., TEOS (tetraethoxysilane) as the main raw material.

Then, the silicon oxide film 38 is made flat by, e.g., CMP (Chemical Mechanical Polishing).

Thus, the inter-layer insulation film 32 of the silicon oxide film 34, the silicon nitride film 36 and the silicon oxide film 38 laid sequentially the latter on the former is formed (see FIG. 7A).

Figure 7B:
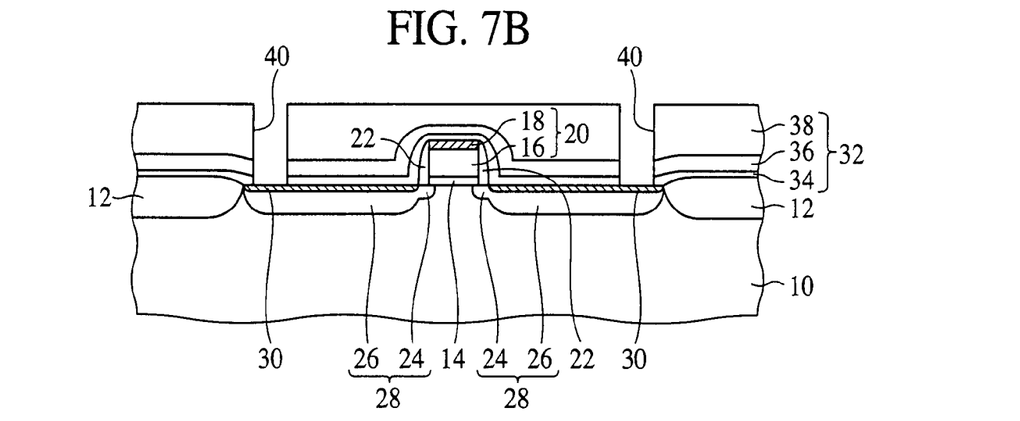

Next, Contact holes 40 are formed in the inter-layer insulation film 32 down to the silicide films 30 by photolithography and dry etching (see FIG. 7B). After the contact holes 40 have been formed, ion implantation for the contact compensation may be performed, and in this case, the ion implantation is followed by the annealing for activating the impurity.

Then, a titanium film of, e.g., a 30 nm-thickness and a titanium nitride film of, e.g., a 20 nm-thickness are deposited the latter on the former by, e.g., CVD to form an adhesion layer 50 of the TiN/Ti structure. Before forming the titanium nitride film following the deposition of the titanium film, thermal processing is performed in a nitrogen atmosphere to nitride the surface of the titanium surface. This processing is for the following purpose, that is, since $WF_6$ as the source gas of a tungsten film 60 which is to be deposited after the adhesion layer 58 has been formed has the property of corroding titanium, by nitriding the surface of the titanium film in advance the titanium is suppressed from corroding to thereby prevent the abnormal growth of the tungsten film.

Figure 7C:
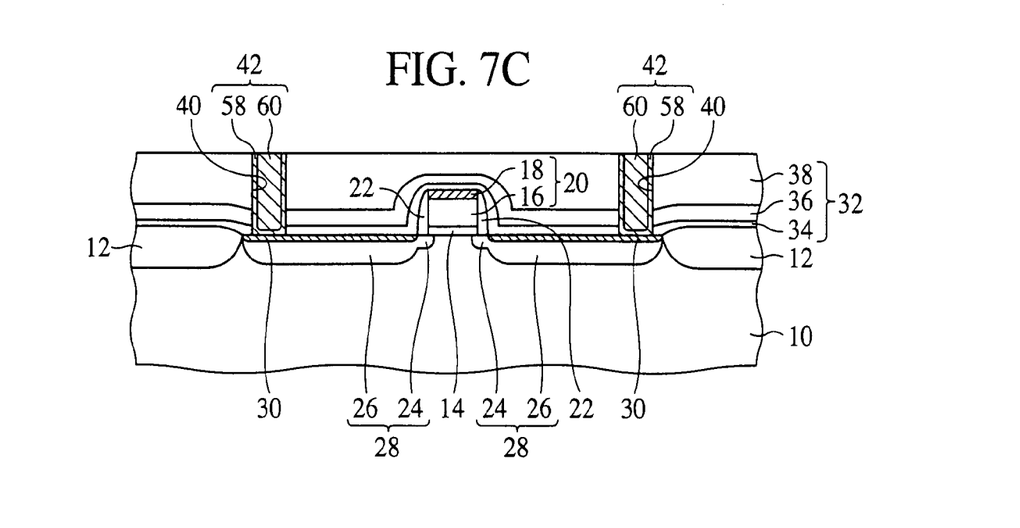

Then, the tungsten film 60 of, e.g., a 400 nm-thickness is deposited on the adhesion layer 58 by, e.g., CVD using, e.g., $WF_6$ as the raw material.

Then, the tungsten film 60 and the adhesion layer 58 are removed flat by, e.g., CMP to leave the adhesion layer 58 and the tungsten film 60 selectively in the contact holes 40. Thus contact plugs 42 of the adhesion layer 58 and the tungsten film 60 are formed in the contact holes 40 (see FIG. 7C).

Figure 8A:
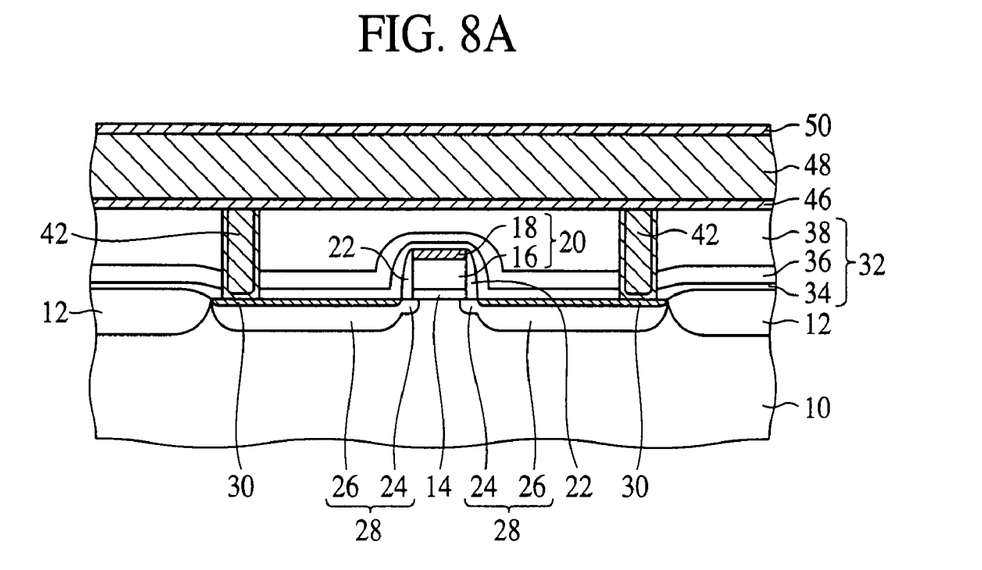
FIGS. 8A-8B are sectional views of the semiconductor device according to the first embodiment of the present invention in the steps of the method for fabricating the semiconductor device, which show the method (Part 4).

Next, a titanium film of, e.g., a 60 nm-thickness and a titanium nitride film of, e.g., a 30 nm-thickness are deposited by, e.g., CVD the latter on the former on the inter-layer insulation film 32 with the contact plugs 42 buried in. Thus, a layer film 46 of the titanium film and the titanium nitride film is formed.

Then, an aluminum film of, e.g., 400 nm-thickness is formed on the layer film 46 by, e.g., sputtering.

Next, a titanium film of, e.g., a 5 nm-thickness and a titanium nitride film of, e.g., a 70 nm-thickness are deposited by, e.g., CVD the latter on the former on the aluminum film 48. Thus, a layer film 50 of the titanium film and the titanium nitride film is formed (see FIG. 8A).

Then, the layer film 50, the aluminum film 48 and the layer film 46 are patterned by photolithography and dry etching. Thus, the interconnection layer 44 is formed of the layer film 46, the aluminum film 48 and the layer film 50, electrically connected to the source/drain diffused layers 28 via the contact plugs 42 and the silicide films 30. Simultaneously therewith, the dummy metal layer 52 is formed of the layer film 46, the aluminum film 48 and the layer film 50, covering a region containing the region above the gate electrode 20 (see FIG. 8B).

Figure 8B:
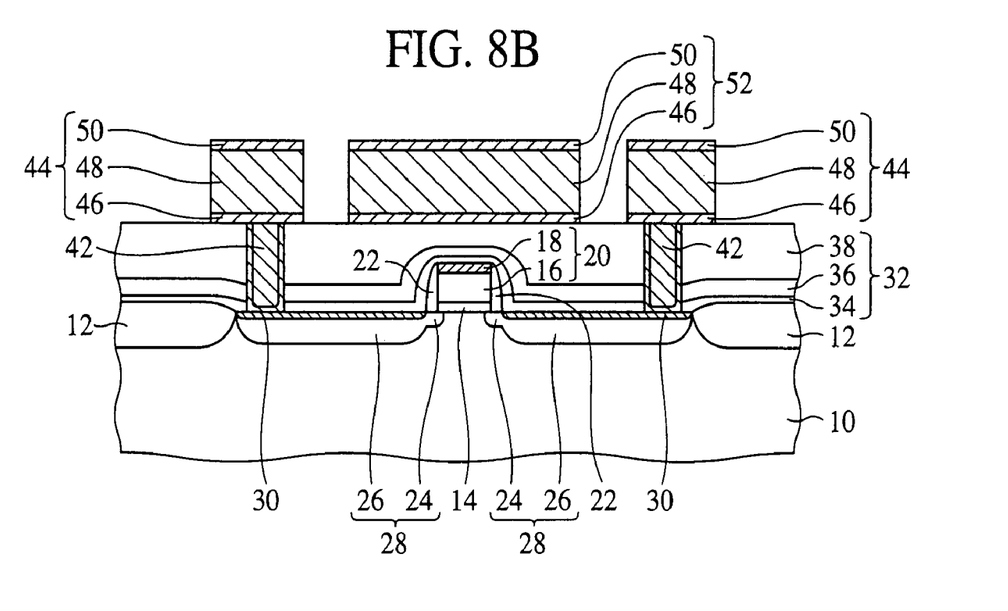

Then, thermal processing is performed in a mixed atmosphere of hydrogen and nitrogen and, e.g., at 400° C. and for 30 minutes for recovering damages to the semiconductor device by etching, etc. Because of the dummy metal layer 52 containing the metal having the property of occluding hydrogen, which is formed, covering the region containing the region above the gate electrode 20, the hydrogen termination of the interface between the silicon substrate 10 and the gate insulation film 14 can be homogeneously suppressed.

Thus, the semiconductor device shown in FIGS. 1A-1B is fabricated.

As described above, according to the present embodiment, a region containing the region above the gate electrode 20 is covered by the dummy metal layer 52 which is formed over the gate electrode 20 with the inter-layer insulation film 32 formed therebetween, is formed of a metal material having the property of occluding hydrogen and has the peripheral part positioned outer of the region where the region for the gate electrode 20 formed in and the device region 11 overlap each other, whereby, in the hydrogen annealing, the hydrogen termination of the interface between the silicon substrate 10 and the gate insulation film 14 can be homogeneously suppressed. By homogeneously suppressing the hydrogen termination itself, no inhomogeneous hydrogen termination takes place in the interface between the silicon substrate 10 and the gate insulation film 14, and thus the MOS transistor can have high relative accuracy.

In the present embodiment, the n type MOS transistor is fabricated, but the present invention is applicable also to p type transistors.

A Second Embodiment

Figure 9:
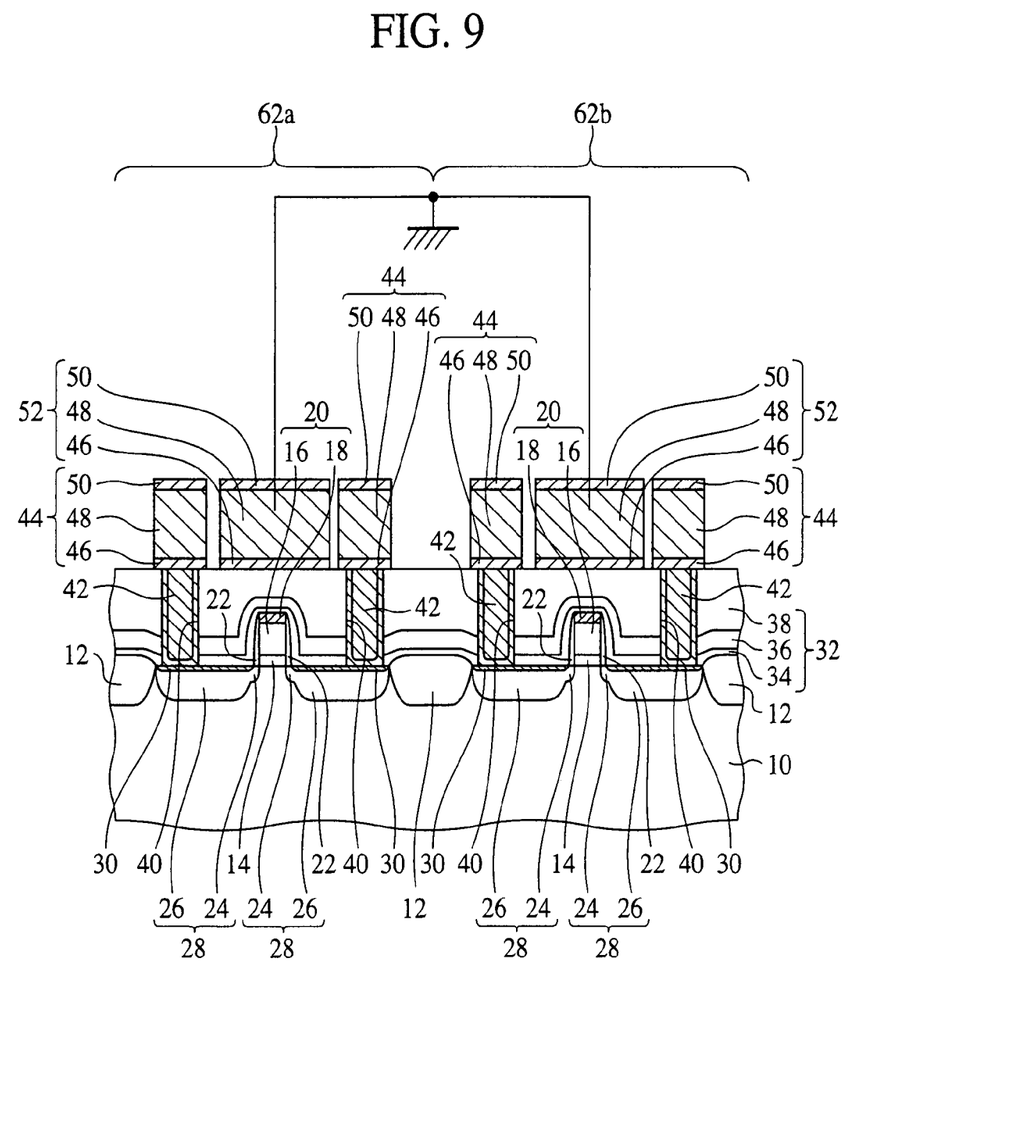
FIG. 9 is a sectional view of the semiconductor device according to a second embodiment of the present invention, which shows a structure thereof.

The semiconductor device and method for fabricating the same according to a second embodiment of the present invention will be explained with reference to FIG. 9. FIG. 9 is a sectional view of the semiconductor device according to the present embodiment, which shows a structure thereof. The same members of the present embodiment as those of the semiconductor device according to the first embodiment are represented by the same reference numbers not to repeat or to simplify their explanation.

The semiconductor device according to the present embodiment is characterized mainly in that a plurality of semiconductor devices having the same structure as the semiconductor device according to the first embodiment are formed on one and the same silicon substrate, and the dummy metal layers of said plurality of semiconductor devices are electrically connected to the earth potential.

That is, as shown FIG. 9, a plurality of semiconductor devices 62a, 62b of the same structure as the semiconductor device according to the first embodiment comprising a MOS transistor are formed on a silicon substrate 10. The semiconductor devices 62a, 62b are transistors forming a pair and constitute a part of, e.g., a differential circuit or a current mirror circuit.

In each of the semiconductor devices 62a, 62b, a dummy metal layer 52 is formed in a region of an inter-layer insulation film 32, which contains the region above the gate electrode 20. The dummy metal layers 52 of the respective semiconductor devices 62a, 62b are electrically connected to each other, and their potentials are fixed to the earth potential.

As described above, in the semiconductor device according to the present embodiment, as in the semiconductor device according to the first embodiment, a region containing the region above the gate electrode 20 of each semiconductor device 62a, 62b is covered by the dummy metal layer 52 formed over the gate electrode 20 with the inter-layer insulation film 32 formed therebetween is formed of a metal material having the property of occluding hydrogen and has the peripheral part positioned outer of the region where the region for the gate electrode 20 formed in and the device region 11 overlap each other, whereby the hydrogen termination of the interface between the silicon substrate 10 and the gate insulation film 14 is suppressed homogeneously in the hydrogen annealing, and the MOS transistor can have higher relative accuracy. Furthermore, in the semiconductor device according to the present embodiment, the dummy metal layers 52 of the respective semiconductor devices 62a, 62b are electrically connected to each other, and their potentials are fixed to the earth potential, whereby external noises can be effectively blocked. Thus, the operation characteristics of the MOS transistors can be improved.

Figure 10:
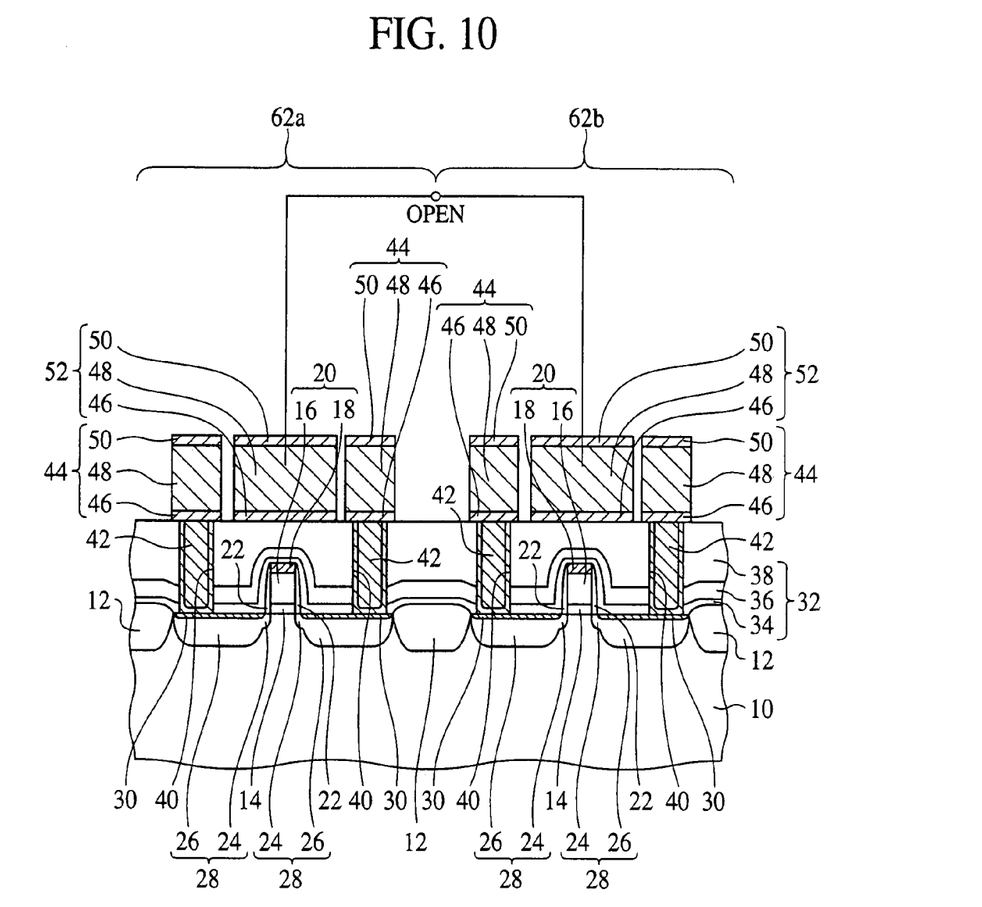
FIG. 10 is a sectional view of the semiconductor device according to a modification of the second embodiment of the present invention.

In the present embodiment, the dummy metal layers 52 of the respective semiconductor devices 62a, 62b are electrically connected to each other, and their potentials are fixed to the earth potential. However, their potentials are not essentially fixed to the earth potential and may be fixed to a prescribed potential. Their potentials may not be essentially fixed to a prescribed potential and may be floating as shown in FIG. 10.

Modified Embodiments

The present invention is not limited to the above-described embodiments and can cover other various modifications.

For example, in the above-described embodiments, the dummy metal layer 52 is formed of the layer film 46 containing a metal having the property of occluding hydrogen, the aluminum film 48, which does not have the property of occluding hydrogen and the layer film 50 containing a metal having the property of occluding hydrogen laid sequentially the latter on the former. But the materials and the structure of the dummy metal layer 52 are not limited to the above. The dummy metal layer 52 may contain at lest one metal of titanium, magnesium (Mg), an alloy containing titanium, and an alloy containing magnesium or others, having the property of occluding hydrogen.

In the above-described embodiments, the steps up to the first interconnection layer 44 including the first interconnection layer 44 forming step are explained, but the second and more interconnection layer may be formed as required. In forming the second and more interconnection layers as well, the same dummy metal layers as the dummy metal layer 52 formed concurrently with forming the first interconnection layer 44. A plurality of the dummy metal layers are formed concurrently with forming the respective interconnection layers, whereby the hydrogen termination of the interface between the silicon substrate 10 and the gate insulation film 14 can be suppressed, and the MOS transistor can have higher relative accuracy.

In the above-described embodiments, the dummy metal layer 52 is formed by patterning the metal films forming the interconnection layer 44, but the dummy metal layer 52 may be formed independently of the interconnection layer 44.

In the above-described embodiments, the dummy metal layer 52 is formed in a rectangular plane shape. However, the plane shape of the dummy metal layer 52 is not essentially rectangular.

In the above-described embodiments, a MOS transistor having the dummy metal layer 52 formed over the gate electrode 20 is formed. However, the MOS transistors having the dummy metal layer 52 formed over the gate electrode 20 and MOS transistors which do not include the dummy metal layer 52 may be mixedly formed on one and the same semiconductor substrate. In this case, in the hydrogen annealing, the hydrogen termination of the interface between the semiconductor substrate and the gate insulation film can be suppressed homogeneously in the MOS transistors having the dummy metal layer 52 to thereby improve relative accuracy, but in the MOS transistors without the dummy metal layer 52, the interface between the semiconductor substrate and the gate insulation film is terminated with hydrogen to thereby recover damages caused in the fabrication steps. That is, depending on purposes of applications, etc. of the respective MOS transistors formed on one and the same semiconductor substrate, the presence of the dummy metal layer 52 is suitably selected to thereby give priority to the improvement of the relative accuracy or to the recovery of damages caused in the fabrication steps.

In the above-described embodiment, the gate electrodes 20 are formed of the polysilicon film 16 and the tungsten silicide film 18 formed the latter on the former. However, the material and the structure of the gate electrode 20 are not limited to the above. For example, the gate electrode 20 may be formed of the polysilicon film 16 without the tungsten silicide film 18.

In the above-described embodiment, the gate insulation film 14 is formed of a silicon oxide film formed by thermal oxidation. However, the material of the gate insulation film 14 is not limited to such material. For example, the gate insulation film 15 may be formed of a silicon oxynitride film.

In the above-described embodiments, the inter-layer insulation film 32 is formed of the silicon oxide film 34, the silicon nitride film 36 and the silicon oxide film 38 laid sequentially the latter on the former. However, the material and the structure of the inter-layer insulation film are not limited to the above.

What is claimed is:

1. A method for fabricating a semiconductor device comprising the steps of:
   defining a device region on a semiconductor substrate;
   forming a gate electrode in the device region with a gate insulation film formed therebetween;
   forming a metal film of a metal material having the property of occluding hydrogen over the gate electrode with an insulation film formed therebetween;
   patterning the metal film to form over the gate electrode a metal layer formed of the metal film and completely covering at least a region where a region for the gate electrode formed in and the device region overlap each other; and
   thermally processing the semiconductor substrate with the metal layer formed on in an atmosphere containing hydrogen.

2. A method for fabricating a semiconductor device according to claim 1, wherein in the step of thermally processing the semiconductor substrate in the atmosphere containing hydrogen, the metal layer homogeneously suppresses the hydrogen termination of the interface between the semiconductor substrate and the gate insulation film.

3. A method for fabricating a semiconductor device according to claim 1, wherein in the step of forming the metal layer, the metal film is patterned to form an interconnection layer and the metal layer both of the metal film.

4. A method for fabricating a semiconductor device comprising the steps of:
   defining a first device region and a second device region on a semiconductor substrate;
   forming a first gate electrode in the first device region with a first gate insulation film formed therebetween, and a second gate electrode in the second device region with a second gate insulation film formed therebetween;
   forming a metal film of a metal material having the property of occluding hydrogen on the first gate electrode with an insulation film formed therebetween;
   patterning the metal film to form over the first gate electrode a metal layer of the metal film and completely covering at least a region where a region for the first gate electrode formed in and the first device region overlap each other; and
   thermally processing the semiconductor substrate with the metal layer formed on in an atmosphere containing hydrogen,
   in the step of thermally processing the semiconductor substrate in the atmosphere containing hydrogen, the metal layer homogeneously suppressing the hydrogen termination of the interface between the semiconductor substrate and the first gate insulation film, and terminating with hydrogen the interface between the semiconductor substrate and the second gate insulation film.

5. A method for fabricating a semiconductor device according to claim 4, wherein in the step of forming the metal layer, the metal film is patterned to form an interconnection layer and the metal layer both of the metal film.

* * * * *